Figure 1:
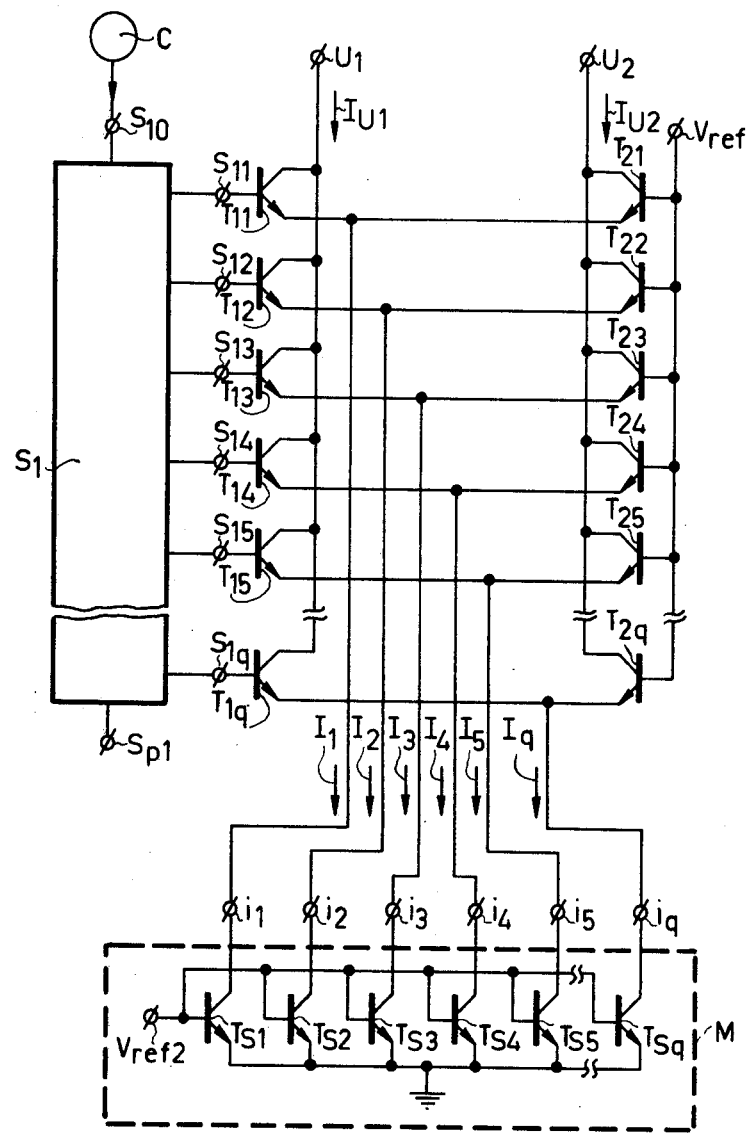

United States Patent [19]

Van de Plassche

[11] 4,125,803
[45] Nov. 14, 1978

[54] CURRENT DISTRIBUTION ARRANGEMENT FOR REALIZING A PLURALITY OF CURRENTS HAVING A SPECIFIC VERY ACCURATELY DEFINED RATIO RELATIVE TO EACH OTHER

[75] Inventor: Rudy J. Van de Plassche, Eindhoven, Netherlands

[73] Assignee: U.S. Philips Corporation, New York, N.Y.

[21] Appl. No.: 790,701

[22] Filed: Apr. 25, 1977

[30] Foreign Application Priority Data

Apr. 29, 1976 [NL] Netherlands ............... 7604570

[51] Int. Cl.$^2$ ............................................. G05F 1/56
[52] U.S. Cl. ............................................. 323/1; 323/4; 330/254
[58] Field of Search ............... 323/1, 4, 16, 19, 22 R, 323/22 T; 330/252, 254, 257, 261, 288, 295; 307/52, 55, 241, 242, 243, 244

[56] References Cited

U.S. PATENT DOCUMENTS

| | | | |
|---|---|---|---|
| 3,783,307 | 1/1974 | Breuer | 330/252 |
| 3,887,863 | 6/1975 | Brokaw | 323/1 |
| 3,891,937 | 6/1975 | Bockelmann | 330/254 |
| 3,982,172 | 9/1976 | Van de Plassche | 323/1 |

*Primary Examiner*—Gerald Goldberg
*Attorney, Agent, or Firm*—Frank R. Trifari; Bernard Franzblau

[57] ABSTRACT

A precision current distribution arrangement includes a multiple current source which supplies $q$ approximately identical currents. These currents are separately applied to the $q$ input terminals of a coupling circuit with $p$ output terminals. With the aid of, for example, shift registers these $q$ currents are transferred to the $p$ outputs in a cyclically permuting fashion, in such a way that at each output during each time interval of the cycle always the same number of currents is transferred, so that per cycle each of the input currents is transferred an equal number of times to a specific output terminal. By subjecting the currents at these output terminals to a low-pass filter action a number of currents is obtained whose ratio relative to each other is very accurately defined.

19 Claims, 5 Drawing Figures

CURRENT DISTRIBUTION ARRANGEMENT FOR REALIZING A PLURALITY OF CURRENTS HAVING A SPECIFIC VERY ACCURATELY DEFINED RATIO RELATIVE TO EACH OTHER

The invention relates to a current distribution arrangement for producing a plurality of currents having a specific very accurately defined ratio or relationship relative to each other which can be expressed in integers.

Such arrangements are needed in various electronic circuits, for example in measuring equipment as a reference current source where different ratios must be available for measuring range selection, and in digital-analog converters where the analog signal is realized by the addition of a number of different currents in accordance with the digital code.

Such a precision current distribution arrangement is known from U.S. Pat. No. 3,982,172. This known circuit arrangement comprises a multiple current source of which each current is each time applied to another output in a cyclically permuting fashion, the number of outputs being equal to the number of outputs of the multiple current source. The arrangement has been adapted so that always one of the output currents of the multiple current source appears at each output so that, after being filtered, all output currents of the current distribution arrangement are exactly equal and the ratio to each other is always unity.

It is an object of the invention to propose a current distribution arrangement of the type mentioned above in which the ratios of the currents to each other can be selected to be unequal to unity and in which said ratios are adjustable, if desired.

For this purpose the invention is characterized in that the arrangement comprises a first multiple current source which can supply $q$ approximately identical currents to $q$ inputs of a first coupling circuit which has $p$ outputs. The coupling circuit comprises a plurality $q$ of $p$-way switches, each $p$-way switch being individually connected between a different input and all $p$ outputs. Control means are provided for controlling the switches under command of a clock signal so that, in a cyclically permuting fashion, a connection pattern is obtained between the $q$ inputs and the $p$ outputs such that, during each time interval, each output is always connected to the same number of current-carrying inputs, that during each time interval always at least one output is connected to more than one input, and that for each $p$-way switch only one switching path is conducting during each time interval if the relevant input carries current (i.e. no input is coupled to more than one output during each time interval).

The invention is based on the recognition that the number of inputs and outputs of the coupling circuit need not be equal, that the number of currents which during each time interval flows to each output need not be equal to one, and that moreover the number of currents which in each time interval flow to each output may differ from each other.

As the number of currents which flows to each output in each time interval is not limited to one, the ratio of the output currents can be varied by suitably controlling the switches. As an example, an arrangement in accordance with FIG. 1 with a coupling circuit which comprises 22 transistors makes it possible to realize the following sets of current values ($I_{u1} : I_{u2}$), 1:10, 2:9, 3:8, 4:7, 5:6, 6:5, 7:4, 8:3, 9:2, 10:1, 11:0 and 0:11.

In a current distribution arrangement in accordance with the invention it may be advantageous that the multiple current source comprises $q$ switchable current sources, which current sources can be actuated upon command of the clock signal, in such a way that during each time interval always the same number of current sources can be actuated, which actuated current sources all supply substantially identical currents.

This step enables a maximum number of current relationships to be obtained using a coupling circuit with a fixed number of transistors. For example, for $p = 2$ all ratios possible with the integers from the series 0, 1, 2, . . . through $q$ can be realized provided that the sum of the two numerals which express the ratio is not greater than $q$.

In addition, it may be of advantage that between the $q$ inputs of the first coupling circuit and a common connection point the multiple current source includes the main current paths of $q$ transistors for supplying substantially identical currents to the $q$ outputs and that the arrangement further comprises a second coupling circuit in accordance with the first coupling circuit, a first output of the second coupling circuit being connected to the said common connection point, and a second multiple current source which can supply substantially identical currents to the inputs of the second coupling circuit.

This step enables very great current ratios to be realized with a combination of two current distribution arrangements, which ratios might also be realized with one current distribution arrangement, but in that case the number of switches required, generally transistors, would be very great.

With such a combination it may further be of advantage that the number of switches and thus the number of inputs of the two coupling circuits is 10, that the switches of the first coupling circuit can be controlled so that the ratio of the currents at two of the outputs of the first-mentioned coupling circuit is $1 : r$, the integer $r$ being variable from 0 through 9, and that the switches of the second coupling circuit can be controlled in such a way that the ratio of the currents at the first output and a second output of the second coupling circuit is $1:s$, the integer $s$ being variable from 0 through 9.

Furthermore, a further step in a combination of current distribution arrangements may be characterized in that the arrangement comprises a third coupling circuit in accordance with the first coupling circuit and a third multiple current source which between each input of the third coupling circuit and a second common point includes the main current path of a transistor for supplying currents which are substantially identical to each other to the inputs of said third coupling circuit, the second common point being connected to a second output of the second coupling circuit.

In respect of the control of the absolute magnitude of the output currents of a current distribution arrangement in accordance with the invention this arrangement may be characterized in that in series with one of the outputs of the first coupling circuit a current source is included and that negative current feedback is provided between the said one output of the first coupling circuit and the first multiple current source.

In a combination of current distribution arrangements in accordance with the invention this step is characterized in that in series with one of the outputs of the first coupling circuit a current source is included and that negative current feedback is provided between the said one output of the first coupling circuit and the second multiple current source.

In order to enable the ratio of the currents at the outputs of the coupling circuit to be readily varied in a distribution arrangement in accordance with the invention, it is of advantage that the arrangement comprises at least one shift register for the cyclically permuting control of said switches and one clock generator for applying a clock signal to the clock inputs of all the shift registers included in the arrangement.

Figure 2:
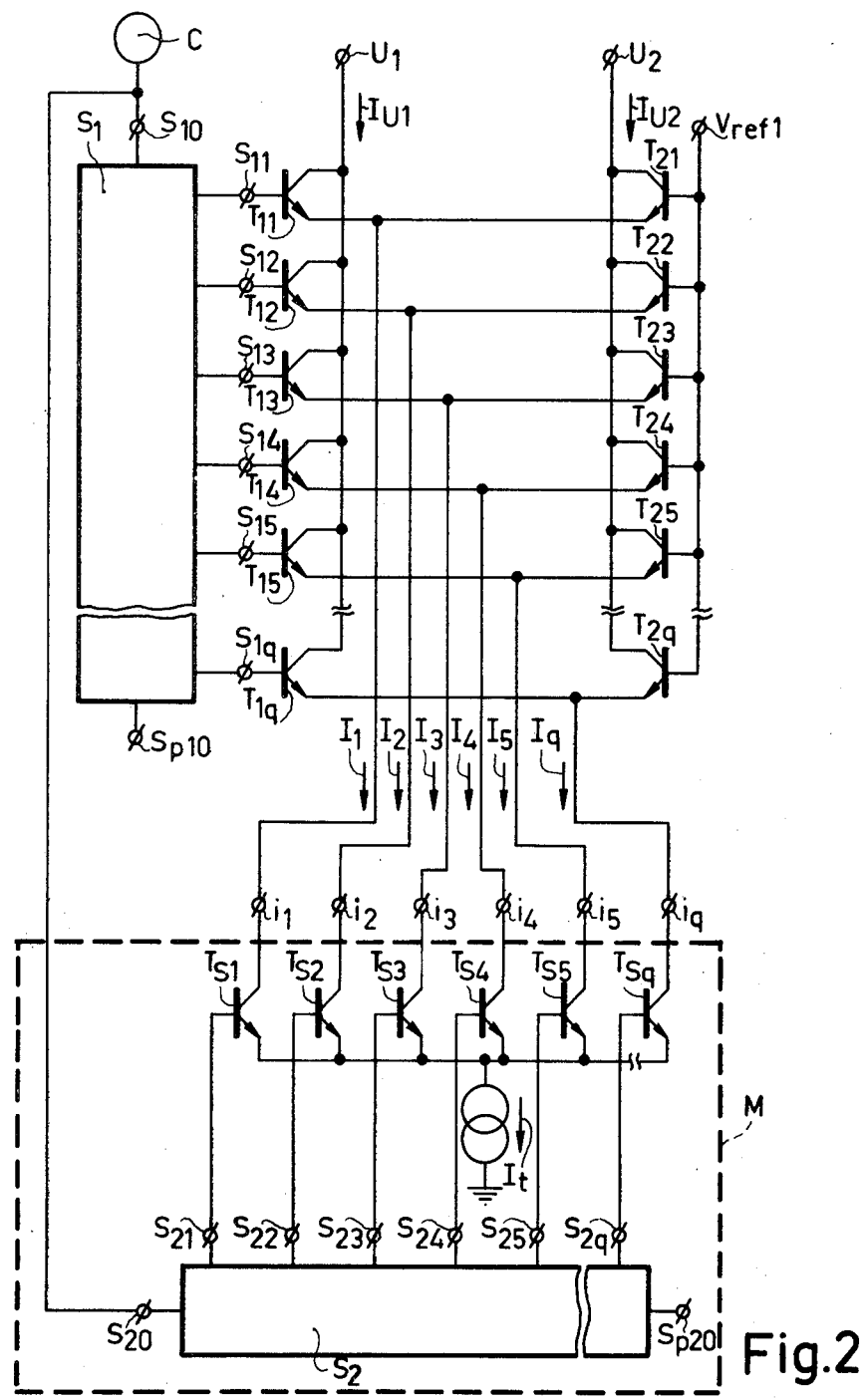
Figure 3:
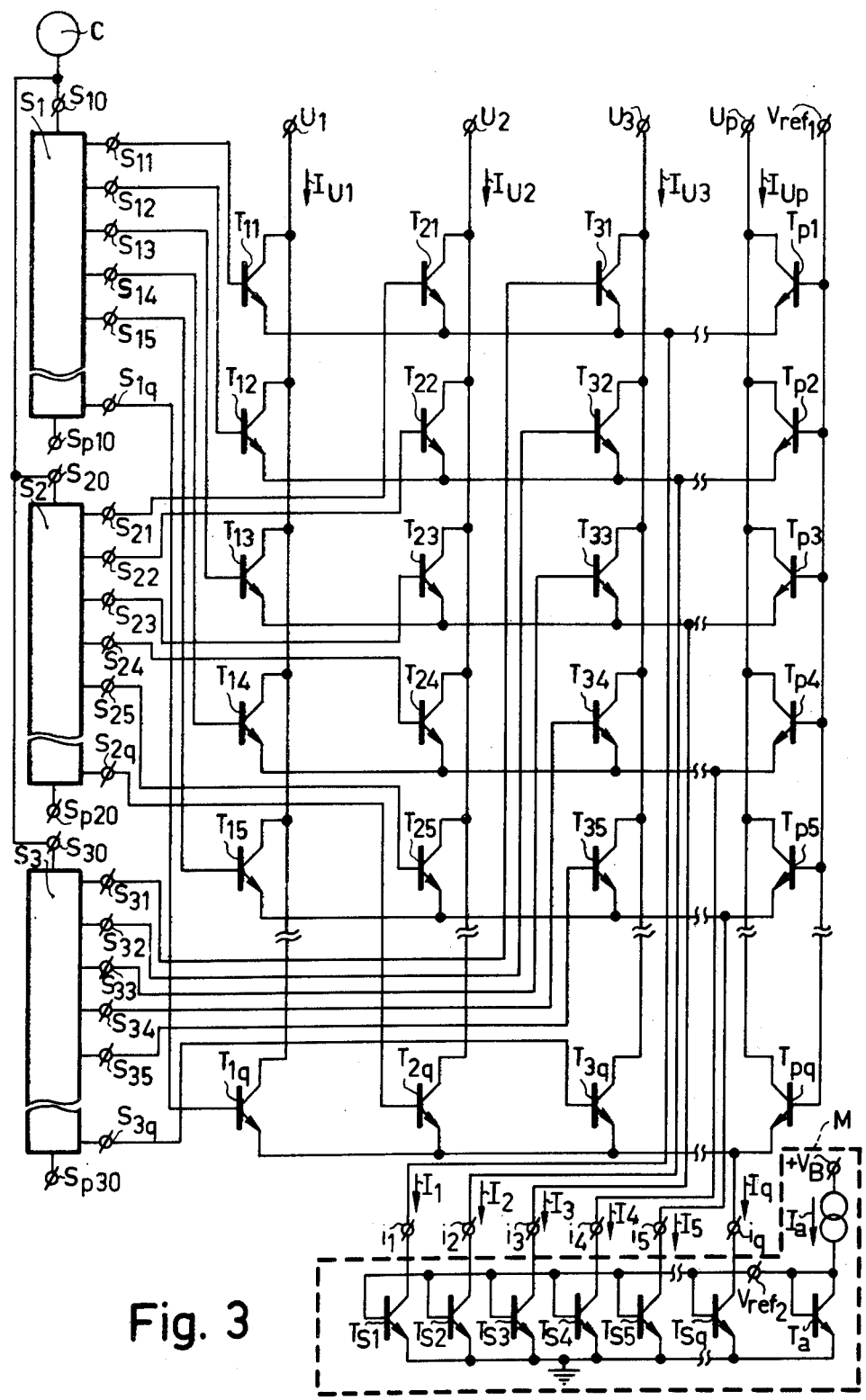
Figure 4:
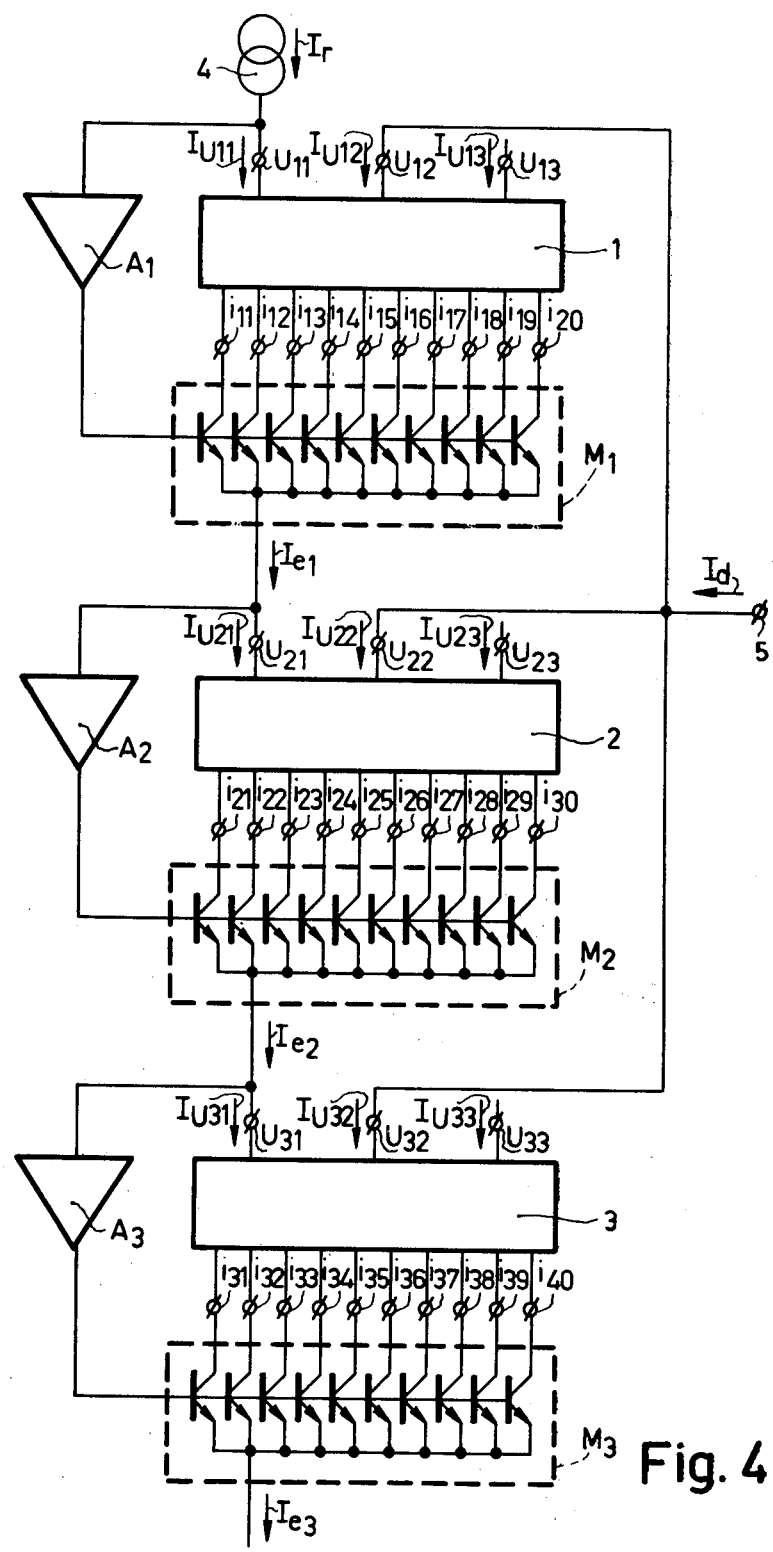
Figure 5:
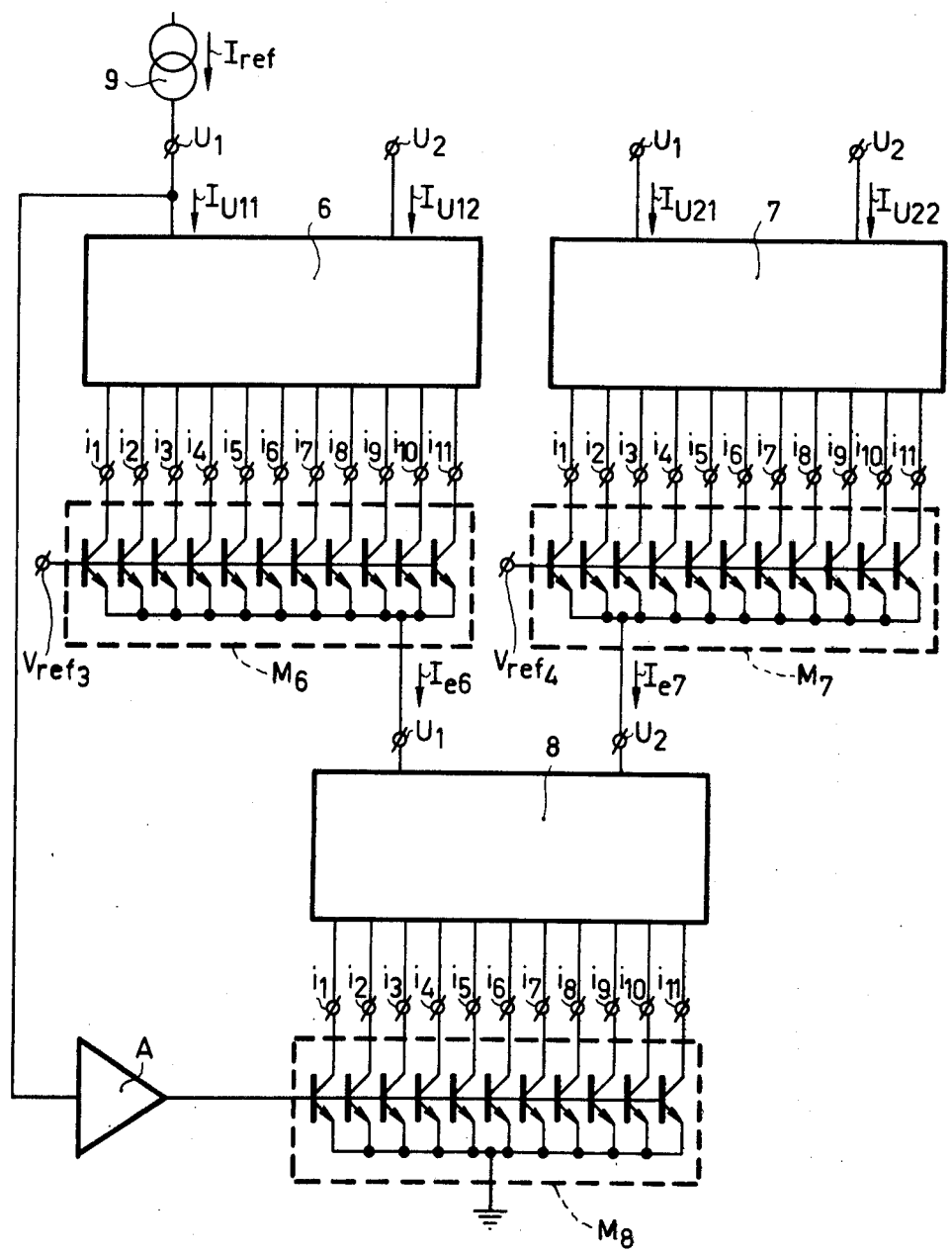

The invention will be described in more detail with reference to the drawing. In the drawing:

FIG. 1 shows a current distribution arrangement in accordance with the invention which comprises $q$ two-way switches, FIG. 2 shows a variant thereof, the input currents of the coupling circuit being variable, FIG. 3 shows a current distribution arrangement in accordance with the invention which comprises a number ($q$) of $p$-way switches, FIG. 4 shows current distribution arrangements in accordance with the invention which are used for realizing a decimally adjustable current source, and FIG. 5 shows a combination of current distribution arrangements in accordance with the invention for realizing very great current ratios, for example 1 : 100.

FIG. 1 shows a current distribution arrangement in accordance with the invention having two outputs. The arrangement comprises $q$ two-way switches. Each switch comprises two transistors $T_{1i}$ and $T_{2i}$, the index $i$ representing the sequence of the switches, for example the transistors $T_{11}$ and $T_{21}$ constitute the first switch, the transistors $T_{12}$ and $T_{22}$ the second switch and $T_{1q}$ and $T_{2q}$ the $q^{th}$ switch. The second index denotes the position of a transistor in a switch related to an output. The emitter of each of the transistors $T_{1i}$ is connected to an input $i_i$ ($i = 1, 2, \ldots, q$), the collector to an output $U_1$ and the base to an output $S_{1i}$ ($i = 1, 2, \ldots q$) of a shift register $S_1$. The emitter of each of the transistors $T_{2i}$ is connected to the emitter of the corresponding transistor $T_{1i}$, the base to a point of reference voltage $V_{ref1}$ and the collector to an output $U_2$.

With the aid of a multiple current source M currents $I_i$ ($i = 1, 2, \ldots q$) which are all substantially equal are applied to the inputs $i_i$, for example in that each input $i_i$ is connected to the collector of a transistor $T_{si}$ whose base-emitter junctions are connected in parallel. The emitters are connected to a point of fixed voltage, in the present instance ground, and the bases to a point which carries a reference potential $V_{ref2}$. When all the transistors $T_{si}$ are substantially identical, the currents $I_i$ are substantially equal. These currents $I_i$ are then determined by the voltage $V_{ref2}$. The currents $I_i$ may also be realized in a different way, for example by including a current source between the emitters of the transistors $T_{si}$ and ground.

As the bases of all of the transistors $T_{2i}$ are interconnected and the collectors are interconnected, these transistors may be replaced by one transistor with a $q$-fold emitter in integrated circuits.

Via an input $S_{10}$ a clock signal from a clock generator C is applied to the shift register $S_1$. As a result of this, the information stored in the shift register is cyclically shifted by one step with each pulse of the clock signal. The shift register $S_1$ has $q$ positions, one for each output $S_{1i}$. The information at these positions is expressed as a logic signal and may have the value 0 or 1. This logic signal has such 0 or 1 levels relative to the reference voltage $V_{ref1}$ that if the signal at a specific output $S_{1i}$ has the value 1 transistor $T_{1i}$ is forward biassed and transistor $T_{2i}$ is reverse biassed, and that if the signal at said output $S_{1i}$ has the value 0, transistor $T_{1i}$ is reverse biassed and transistor $T_{2i}$ is forward biassed. Consequently, one of the two transistors $T_{1i}$ and $T_{2i}$ is always conductive and the current $I_i$ is always transferred to one of the two outputs $U_1$ and $U_2$. Although in the present example each transistor pair $T_{1i}$, $T_{2i}$ is operated at one of the base electrodes, it is obviously also possible to operate the two transistors differentially.

If the information stored in the shift register is such that there is a 1 at $r$ of the $q$ positions and a 0 at the other positions, there will always be $r$ transistors $T_1$ forward biassed. All the ($q-r$) transistors $T_2$ which do not correspond to these $r$ transistors $T_1$ are then forward biassed, so that $r$ currents $I_i$ are transferred to the output $U_1$ and ($q-r$) currents $I_i$ to the output $U_2$.

If the currents $I_i$ have an average value $I_0$ and each have a deviation $\Delta_i$ from this average value, then $I_i = I_0 + \Delta_i$ ($i = 1, 2, \ldots q$), the sum of all deviations $\Delta_i$ and thus the average deviation being zero because $I_0$ has been defined as the average. Per full cycle of the shift register $S_1$ each current $I_i$ appears $r$ times at the output $U_1$ and ($q-r$) times at output $U_2$, so that the currents $I_{U1}$ and $I_{U2}$ at the outputs $U_1$ and $U_2$ respectively have an exact average ratio relationship of $r : q-r$ over a complete cycle. These currents $I_{U1}$ and $I_{U2}$ consist of a constant component $rI_0$ and ($q-r$)$I_0$ and a ripple with an average value of zero and a master frequency equal to the frequency of the clock signal of the clock generator C. If these comparatively small ripple currents are filtered out, for example with RC-networks, the currents $I_{U1}$ and $I_{U2}$ become $rI_0$ and ($q-r$)$I_0$ respectively.

By programming the shift register $S_1$ any ratio $r:q-r$, with $0 \leq r \leq q$, can be realized. For example, for $q = 5$ the ratios 0:5, 5:0, 1:4, 2:3, 3:2, and 4:1 can be realized.

By means of the circuit arrangement of FIG. 1 it is not possible to realize every ratio. For example, the ratios 1:1, 1:2, 2:1, 1:3 and 3:1 are missing. This is because the quantity $q$ is not variable. For this it would for example be necessary to make the number of inputs and switches variable.

FIG. 2 shows a circuit arrangement in accordance with the invention having a variable number of switches and inputs, the active number and not the absolute number being variable.

The circuit arrangement of FIG. 2 is similar to the arrangement of FIG. 1, except for the multiple current source M. In this example said multiple current source M comprises a current source $I_t$ whose current is distributed over the $q$ inputs $i_i$ via the emitter-collector paths of $q$ switchable transistors $T_{si}$ ($i = 0, 1, \ldots q$). The base electrode of each transistor $T_{si}$ is each time connected to one output $S_{2i}$ of a shift register $S_2$, which furthermore has a clock input $S_{20}$ to which the clock signal from the clock generator C is applied.

If a certain pattern of zeros and ones is stored in the shift register in the same way as with the shift register $S_1$, this pattern is shifted stepwise under control of the clock signal. Assuming that this pattern is such that a number $S$ of the $q$ transistors always conduct, this pattern in comparison with the pattern stored in the shift register $S_1$ being such that if a transistor $T_{1i}$ conducts the transistor $T_{si}$ is always also conductive. If conduction of a transistor $T_{1i}$ coincides with cut-off of a transistor $T_{si}$, the circuit arrangement would operate in the same way as in the situation where the number of ($r$) transistors $T_{1i}$ which conduct at any moment is one less, i.e. ($r-1$).

In the circuit arrangement of FIG. 2 the equality of the currents $I_i$ is determined by the equality of the transistors $T_{si}$. In order to minimize the ripple currents at the outputs $U_1$ and $U_2$, the transistors $T_{si}$ should therefore be highly identical.

If the number of switches is $q$, the number of transistors $T_{si}$ which conduct at any moment is S, and the number of transistors $T_{1i}$ which conduct at any moment, the transistors $T_{si}$ being also conductive, is $r$. there will always be $r$ currents $I_i$ to output $U_1$ and $s-r$ currents $I_i$ to output $U_2$. As per cycle each current $I_i$ appears $r$ times at output $U_1$ and $(S-r)$ times at output $U_2$, the ratio of the currents $I_{U1}$ and $I_{U2}$ is exactly $r:s-r$ (neglecting the ripple currents which can simply be filtered out) S then equals maximum $q$ and minimum $r$.

In the numerical example relating to the circuit arrangement of FIG. 1 with $q = 5$, six different ratios could be realized. The additional step in accordance with FIG. 2 makes it possible to obtain all other ratios that can be formed with the numerals 0, 1, 2, 3, 4 and 5, provided that the sum of the numerals which express such a ratio does not exceed 5, such as 1:1, 1:2, 1:3, 2:1 and 3:1. In general all ratios possible with the numerals 0, 1, 2, ... $q$ can be realized with the circuit arrangement of FIG. 2 by means of $q$ switches $T_{1i}$, $T_{2i}$, provided that the sum of the numerals expressing this ratio is not greater than $q$.

FIG. 3 shows a circuit arrangement in accordance with FIG. 1 which has been extended to provide $p$ outputs. In the multiple current source M the reference voltage $V_{ref2}$ in this example is produced by passing a reference current $I_a$ through a diode $T_a$. The diode $T_a$ is included between the point of reference voltage $V_{ref2}$ and ground.

Each switch comprises $p$ transistors $T_{1i}$, $T_{2i}$, ... $T_{ji}$, ... $T_{pi}$, the index $j$ denoting the sequence of the transistors $T_{ji}$ in each multiple switch. Of every $p$ transistors $T_{ji}$ ($j = 1, 2, ... p$) the emitters are jointly connected to the input $i_i$. The collectors of every $q$ transistors $T_{ji}$ ($i = 1, 2, ... q$) are jointly connected to an output $U_j$. For every $q$ transistor $T_{ji}$ ($i = 1, 2, ... q$) a shift register $S_j$ is provided with outputs $S_{ji}$ ($i = 1, 2, ... q$), which outputs $S_{ji}$ are each time connected to the base electrodes of each time one transistor $T_{ji}$, except for all $q$ transistors $T_{pi}$, whose base electrodes are connected to a point of reference voltage $V_{ref1}$. The clock inputs $S_{j0}$ of all ($p-1$) shift registers $S_j$ receive a clock signal from the clock generator C.

If it is assumed that all shift registers $S_j$ are programmed so that each time only one transistor of each group of $p$ transistors $T_{ji}$ ($j = 1, 2, ... p$) can conduct and that the number of transistors per group $T_{ji}$ ($i = 1, 2, ... q$) which is conductive each time is $r_j$, the average values of the currents $I_{uj}$ at the outputs $U_j$ will have the ratios $r_1:r_2: ... :r_j: ... :r_{p-1}:q - (r_1 + r_2 + ... + r_j + ... + r_{p-1})$.

If for example $r_1 = 2$, $r_2 = 4$, $r_3 = 8$, $p = 4$, and $q = 15$, the ratios of the currents at the outputs $U_1$, $U_2$, $U_3$ and $U_4$ will be 2:4:8:1.

More possibilities are obtained when, like in the arrangement of FIG. 2, the arrangement of FIG. 3 is provided with switchable current sources at the inputs $i_i$.

The shift registers $S_j$ in the arrangements of FIGS. 1, 2 and 3 are programmable. For this purpose these shift registers have programming inputs $S_{pi0}$. This programming can be effected in known manner by each time inserting a 0 or a 1 at a specific position of the shift register. The inserted information is shifted one step upon each pulse of the clock signal until all positions are "filled" and the shift register is programmed.

In the circuit arrangements of FIGS. 1, 2 and 3 the ratio of the output currents $I_{uj}$ to each other is always exactly defined, but not their absolute value which depends on the average $I_0$ and is for example dependent on the reference voltage $V_{ref2}$ or the number of transistors $T_{si}$ (FIG. 2) which have been included in the circuit. FIG. 4 gives an example of a circuit arrangement in accordance with the invention which also enables the absolute value of the output currents to be adjusted exactly.

The circuit arrangement of FIG. 4 comprises a programmable current distribution arrangement 1, for example in accordance with FIG. 3. For this current distribution arrangement 1 $p = 3$ and $Q = 10$. The three outputs are designated $U_{11}$, $U_{12}$ and $U_{13}$ and the ten inputs $i_{11}$, $i_{12}$, ... $i_{19}$, $i_{20}$. The ten-fold current source M1 associated with these ten inputs $i_{1i}$ comprises 10 transistors which are highly identical to each other, whose base electrodes are interconnected and whose emitter electrodes are interconnected. The collector electrodes each lead to one input $i_{1i}$ of the current distribution arrangement 1. It is assumed that the current distribution arrangement 1 is programmed so that the ratio of the output currents $I_{u11}$, $I_{u12}$ and $I_{u13}$ at the outputs $U_{11}$, $U_{12}$ and $U_{13}$ respectively is $1:d_1:(9-d_1)$ (for the programming see the description with reference to FIG. 3). With the aid of a current source 4 a reference current $I_R$ is applied to the output $U_{11}$, the output being connected to the common base electrodes of the transistors of this 10-fold current source M1 via a non-inverting current amplifier $A_1$, which consequently amplifies the difference $I_R - I_{u11}$. Owing to negative feedback the current $I_{u11}$ at output $U_{11}$ will always be substantially equal to the reference current $I_R$, the degree of equality being determined by the gain factor of the amplifier $A_1$.

Owing to the negative feedback and the programming, the currents $I_{u11}$, $I_{u12}$ and $I_{u13}$ equal $I_R$, $d_1 I_R$, and $(9-d_1)I_R$ respectively, in which $d_1$ may assume all values 0, 1 to 9 inclusive. The total emitter current $I_{e1}$ of the transistors of the 10-fold current source M1 is then equal to 10 $I_R$.

The circuit arrangement of FIG. 4 further comprises a second and a third current distribution arrangement 2 and 3 respectively, for example in accordance with FIG. 3 with $p = 3$ and $q = 10$. These current distribution arrangements 2 and 3 each have 3 outputs $U_{21}$, $U_{22}$, $U_{23}$ and $U_{31}$, $U_{32}$, $U_{33}$ respectively in which the currents $I_{u21}$, $I_{u22}$, $I_{u23}$, $I_{u31}$, $I_{u32}$ and $I_{u33}$ flow respectively, and each have 10 inputs $i_{21}$, $i_{22}$ through $i_{30}$ and $i_{31}$, $i_{32}$ through $i_{40}$ respectively. To these inputs $i_{21}$ and $i_{31}$ currents are applied with the aid of two multiple current sources M2 and M3 respectively, each consisting of 10 highly identical transistors with both common base electrodes and common emitter electrodes. The collector electrodes lead to the respective inputs $i_{21}$ and $i_{31}$. The outputs $U_{21}$ and $U_{31}$ are connected to the common base electrodes of the transistors of the 10-fold current sources M2 and M3 respectively via non-inverting current amplifiers $A_2$ and $A_3$ respectively. The total emitter current $I_{e1}$ of the transistors of the 10-fold current source $M_1$ is applied to the output $U_{21}$ of the current distribution arrangement 2 and the total emitter current $I_{e2}$ of the transistors of the 10-fold current source $M_2$ to the output $U_{31}$ of the current distribution arrangement 3.

If the current distribution arrangement 2 is programmed so that the output currents $I_{u21}$, $I_{u22}$ and $I_{u23}$ have a ratio of $1:d_2:9-d_2$, then $I_{u21}$ 10 $I_R$, $I_{u22} = 10\, d_2 I_R$, $I_{u23} = 10\,(9-d_2)I_R$, and $I_{e2} = 10\, I_{e1} = 100\, I_R$, because $I_{e1} = 10\, I_R$. If the current distribution arrangement 3 is programmed so that the output currents $I_{u31}$, $I_{u32}$ and $I_{u33}$ have a ratio of $1:d_3:9-d_3$, then $I_{u31}$ 100 $I_R$, $I_{32} = 100\, d_3 I_R$, $I_{U33} = 100\,(9-d_3)I_R$, and $I_{e3} = 1000\, I_R$, because $I_{e2} = 100\, I_R$. The current $I_{e3}$ may then again be applied to a subsequent current distribution arrangement.

The outputs $U_{12}$, $U_{22}$ and $U_{32}$ are connected to an output terminal 5. The current $I_d$ which may flow through this output terminal 5 then equals $I_{u12} + I_{u22} + I_{u32}$, or:

$$I_d = (d_1 + 10\, d_2 + 100\, d_3)\, I_R,$$

where $d_1$, $d_2$ and $d_3$ may assume all values from 0 to 9 inclusive. Thus, by adjusting the parameters $d_1$, $d_2$ and $d_3$ all integral multiples of $I_R$ from 0 to 999 $I_R$ can be obtained. The circuit arrangement constitutes a decimally adjustable precision current source. By increasing the number of current distribution arrangements a greater number of decimals can be realized. It is alternatively possible to obtain this adjustment with the aid of a digital signal, yielding a decimally organized digital-to-analog converter.

In the circuit arrangement of FIG. 4 each current distribution arrangement receives negative feedback via an amplifier. However, it is alternatively possible to provide direct negative feedback from the output $U_{11}$ of the current distribution arrangement 1 to the common base electrodes of the transistors of the 10-fold current source $M_3$.

If a very high current ratio is desired, the arrangements of FIGS. 1, 2 and 3 are not suitable because the number of transistors which is required then becomes very large. However, a high current ratio can be realized by combining current distribution arrangements with smaller ratios. FIG. 5 by way of example shows a combination of three current distribution arrangements for realizing a ratio of 1:100.

The arrangement of FIG. 5 comprises three current distribution arrangements 6, 7 and 8, for example in accordance with FIG. 1. These three current distribution arrangements are adapted and programmed so that $q = 11$, $p = 2$ and $r = 1$, or that the relationship of the output currents at the two outputs $U_1$ and $U_2$ is 1:10. These current distribution arrangements 6, 7 and 8 are associated with 11-fold current sources $M_6$, $M_7$ and $M_8$ respectively, each comprising eleven highly identical transistors of which for each current source $M_6$, $M_7$ and $M_8$ both the base electrodes and the emitter electrodes are interconnected and whose collector electrodes each lead to one input $i_i$ of the associated current distribution arrangement 6, 7 or 8. The common base electrodes of the transistors associated with the current sources $M_6$ and $M_7$ are connected to points which are at a reference voltage $V_{ref3}$ and $V_{ref4}$ respectively, which voltages are preferably equal. Each of the three current distribution arrangements has two outputs $U_1$ and $U_2$, the currents through these outputs having a ratio of 1:10 in the present example (it is obvious that different ratios are also possible). The outputs $U_1$ and $U_2$ of the current distribution arrangement 8, in which currents $I_{e6}$ and $I_{e7}$ flow respectively, are connected to the common emitter electrodes of the transistors of the 11-fold current sources $M_6$ and $M_7$ respectively. The input $U_1$ of current distribution arrangement 6 is connected to the output of a current source 9 which supplies a current $I_{ref}$ and via a non-inverting current amplifier A to the common base electrodes of the transistors of the 11-fold current source $M_8$, the common emitter electrodes of said transistors being connected to a point of reference voltage, in the present example ground.

The currents at the outputs $U_1$ and $U_2$ of the current distribution arrangements 6 and 7 are $I_{u11}$, $I_{u12}$, $I_{u21}$ and $I_{u22}$, where $I_{u12}:I_{u11} = I_{u22}:I_{u21} = 1:10$. Owing to the negative feedback via the current amplifier A $I_{u11} = I_{ref}$ so that $I_{u12} = 10\, I_{ref}$. The current $I_{e6}$ then equals 11 $I_{ref}$. Since $I_{e7} = 10\, I_{e6}$, it follows that $I_{e7}$ equals 110 $I_{ref}$. This current $I_{e7}$ is distributed over the outputs $U_1$ and $U_2$ of the current distribution arrangement 7 in an exact ratio of 1:10. It follows that $I_{u21} = 10\, I_{ref}$ and $I_{u22} = 100\, I_{ref}$. Thus, the ratio of the currents $I_{u11}$, $I_{u12}$, $I_{u21}$ and $I_{u22}$ is 1:10:10:100.

The invention is not limited to the examples shown. For example, the switches may be replaced by suitable elements such as field-effect transistors and these switches may be actuated by means other than a shift register.

I claim:

1. A current distribution arrangement for producing a plurality $p$ of currents having a specific very accurately defined relationship relative to each other which can be expressed in integers comprising, a multiple current source which supplies $q$ approximately identical currents to $q$ inputs of a coupling circuit which has $p$ inputs, with $q > p$, control means for coupling a periodic control signal to the coupling circuit in a cyclically permuting fashion, said coupling circuit including switching means responsive to the periodic control signal for selectively interconnecting said $q$ inputs with $n$ of the $p$ outputs, wherein $p \geqq n$, so as to establish a connection pattern between the $q$ inputs and the $p$ outputs such that each of the $n$ outputs within a constant cycle time defined by the control signal is consecutively coupled at least once to each of the inputs during $q$ identical time intervals, that at least one of the $n$ outputs is consecutively coupled at least two times to each of the $q$ inputs during the $q$ time intervals, and that during each time interval none of the inputs are coupled to more than one output.

2. A current distribution arrangement as claimed in claim 1, characterized in that the multiple current source comprises $q$ switchable current sources which can be actuated upon command of a clock signal so that during each time interval always the same number of current sources are actuated, which actuated current sources all supply substantially identical currents.

3. A current distribution arrangement as claimed in claim 2 further comprising a current source connected in series with one output of the coupling circuit, and means providing a negative current feedback between said one output of the coupling circuit and an input of the multiple current source.

4. A current distribution arrangement as claimed in claim 2 wherein said control means comprises a shift register for controlling said switching means and a clock signal generator for applying a clock signal to a clock input of the shift register.

5. A current distribution arrangement as claimed in claim 1 further comprising a common connection point connected to the multiple current source, characterized in that between the $q$ inputs of the coupling circuit and said common connection point the multiple current source includes the main current paths of $q$ transistors for supplying substantially identical currents to the $q$ outputs and that the arrangement further comprises a second coupling circuit similar to the first coupling circuit, means connecting a first output of the second coupling circuit to said common connection point, and a second multiple current source coupled to the inputs of the second coupling circuit to supply substantially identical currents thereto.

6. A current distribution arrangement as claimed in claim 5 wherein each of the two coupling circuits includes 10 switches so that the number of inputs of each of the two coupling circuits thus is 10, the switches of the first coupling circuit being controlled so that the relationship of the currents at two of the outputs of the first-mentioned coupling circuit is 1:$r$, the integer $r$ being variable from 0 to 9 inclusive, the switches of the second coupling circuit being controlled so that the relationship of the currents at the first output and at a second output of the second coupling circuit is 1:$s$, the integer $s$ being variable from 0 to 9 inclusive.

7. A current distribution arrangement as claimed in claim 5, characterized in that the arrangement comprises a third coupling circuit similar to the first coupling circuit and a third multiple current source which between each input of the third coupling circuit and a second common point includes the main current path of a transistor for supplying currents which are substantially identical to each other to the inputs of said third coupling circuit, and means connecting the second common point to a second output of the second coupling circuit.

8. A current distribution arrangement as claimed in claim 5 further comprising a current source in series with one of the outputs of the first coupling circuit, and means providing a negative current feedback between said one output of the first coupling circuit and the second multiple current source.

9. A current distribution arrangement as claimed in claim 1 further comprising a current source in series with one of the outputs of the coupling circuit, and means providing a negative current feedback between said one output of the coupling circuit and the multiple current source.

10. A current distribution arrangement as claimed in claim 1 wherein said control means comprises at least one shift register for the control of said switching means and a clock generator for applying a clock signal to a clock input of the shift register.

11. A precision current source for producing $p$ individual currents having an accurately defined relationship to each other expressed in integers comprising, a multiple current source having $q$ outputs and means for providing $q$ approximately equal currents at said $q$ outputs, a coupling circuit having $q$ input terminals individually coupled to the $q$ outputs of the multiple current source and $p$ output terminals, wherein $q$ is greater than $p$, said coupling circuit including switching means for selectively interconnecting said $q$ input terminals to $n$ of the $p$ output terminals, wherein $p$ is greater than or equal to $n$, means for generating a cyclically permuting periodic control signal providing $q$ time intervals per cycle, and means for applying the periodic control signal to the coupling circuit to switch the switching means so as to establish a connection pattern between the input terminals and the output terminals so that during each of said $q$ time intervals of a cycle each output terminal is connected to the same number of input terminals, but not necessarily the same number as any other output terminal, that during each of said time intervals at least one output terminal is connected to more than one input terminal so as to receive a number of equal currents determined by the number of input terminals to which it is connected, and that no input terminal is coupled to more than one output terminal during each of said time intervals.

12. A current source as claimed in claim 11 wherein said switching means comprises a plurality $q$ of $p$-way switches each having $p$ switching paths, said switches being controlled by the control signal so that only one switching path can conduct current during any one of said time intervals.

13. A current source as claimed in claim 11 wherein the multiple current source includes $q$ switchable current sources which supply substantially equal currents, and means for actuating the switchable current sources so that the same number of current sources are actuated during each time interval of a cycle and a number of current sources less than $q$ can be actuated in each said time interval.

14. A current source as claimed in claim 1 wherein the control signal generating means includes a first shift register coupled to the switching means to control the operation thereof, said multiple current source includes a second shift register which comprises said actuating means for the switchable current sources, and a clock signal generator for applying a clock signal to a clock input of the first and second shift registers.

15. A current source as claimed in claim 11 wherein said control signal generating means includes means for altering the control signal so as to switch the switching means to establish a different connection pattern between the input and output terminals whereby the relationship of the currents appearing at said $p$ output terminals can be changed.

16. A current source as claimed in claim 15 wherein said switching means comprises a plurality $q$ of $p$-way switches each having $p$ switching paths, said switches being controlled by the control signal so that only one switching path can conduct current during any one of said time intervals.

17. A current source as claimed in claim 15 wherein the multiple current source includes $q$ switchable current sources which supply substantially equal currents, and means for actuating the switchable current sources so that the same number of current sources are actuated during each time interval of a cycle and a number of current sources less than $q$ can be actuated in each said time interval.

18. A current source as claimed in claim 15 wherein the control signal generating means includes a shift register coupled to the switching means to control the operation thereof and a clock signal generator for applying a clock signal to a clock input of the shift register.

19. A current source as claimed in claim 15 further comprising low-pass filter means coupled to said $p$ output terminals.

* * * * *